United States Patent [19]

Gelsomini

[11] Patent Number: 5,014,112

[45] Date of Patent: May 7, 1991

[54] SEMICONDUCTOR INTEGRATED CIRCUIT DEVICE HAVING MIRROR IMAGE CIRCUIT BARS BONDED ON OPPOSITE SIDES OF A LEAD FRAME

[75] Inventor: Tito Gelsomini, Rieti, Italy

[73] Assignee: Texas Instruments Incorporated, Dallas, Tex.

[21] Appl. No.: 213,463

[22] Filed: Jun. 29, 1988

Related U.S. Application Data

[63] Continuation of Ser. No. 797,270, Nov. 12, 1985, abandoned.

[51] Int. Cl.⁵ .............................................. H01L 29/52
[52] U.S. Cl. ......................................... 357/70; 357/72; 357/74; 357/75; 357/80; 174/52.4; 437/220
[58] Field of Search ........................ 357/70, 72, 74, 75

[56] References Cited

U.S. PATENT DOCUMENTS

| | | | |
|---|---|---|---|
| 3,955,023 | 5/1976 | Blakely | 174/68.5 |
| 3,984,860 | 10/1976 | Logue | 357/75 |
| 4,038,488 | 7/1977 | Lin | 357/80 |
| 4,056,681 | 11/1977 | Cook, Jr. | 357/80 |
| 4,195,195 | 3/1980 | de Miranda et al. | 357/70 |
| 4,241,360 | 12/1980 | Hambor et al. | 357/80 |
| 4,264,917 | 4/1981 | Ugon | 357/80 |

FOREIGN PATENT DOCUMENTS

| | | | |
|---|---|---|---|
| 55-48954 | 4/1980 | Japan | 357/70 |
| 56-137665 | 10/1981 | Japan | 357/70 |
| 58-141544 | 8/1983 | Japan | 357/70 |
| 59-172262 | 9/1984 | Japan | 357/70 |
| 60-260142 | 12/1985 | Japan | 357/70 |
| WO82/01295 | 4/1982 | PCT Int'l Appl. | 357/70 |

OTHER PUBLICATIONS

IBM Technical Disclosure Bulletin, vol. 27, No. 11, Apr. 1985, "Semiconductor Packaging Using Chip Mate Concept With Dual Inline Package (DIP) for Bonded Vias, Terminals and Reflowed Solder Pads and Using Chip Carrier for Reflowed Solder Pads and Bonded Terminals."

*Primary Examiner*—Rolf Hille
*Assistant Examiner*—Steven Loke
*Attorney, Agent, or Firm*—Lawrence J. Bassuk; Thomas W. DeMond; Melvin Sharp

[57] ABSTRACT

A pair of like, semiconductor integrated circuit bars, such as DRAMS, have second level bonding pads formed over their active surfaces in mirror images of one another. The bars then become bonded to opposite sides of frame bonding pads of a lead frame to double the capacity of a normally encapsulated integrated circuit. The normal bar bonding pads of the circuit bars are arranged identical to one another, and a patterned and etched second level of metal forms second level lands over the bar bonding pads, the mirror image second level bonding pads and second level leads connecting corresponding second level lands to second level pads. A pair of 256K DRAMS can be connected either 256K×2 or 512K×1 by use of dummy second level pads for DATA-IN/OUT and ROW ADDRESS STROBE connection.

25 Claims, 4 Drawing Sheets

SEMICONDUCTOR INTEGRATED CIRCUIT DEVICE HAVING MIRROR IMAGE CIRCUIT BARS BONDED ON OPPOSITE SIDES OF A LEAD FRAME

This application is a continuation of application Ser. No. 06/797,270, filed 11/12/85, now abandoned.

RELATED CASES

The subject matter of my related copending application Ser. No. 797,269, filed on Nov. 12, 1985 is pertinent to the subject matter of the present application.

BACKGROUND

The present invention relates to a method of packaging semiconductor integrated circuit chips, or, as they are sometimes referred to, bars more particularly, to forming and encapsulating such bars.

In the fabrication of semiconductor circuits normally a silicon slice is divided up into a number of bars, typically about 150, each of which are later separated and encapsulated. In the encapsulation process the bonding pads on each bar are attached by means of gold thread to the pin leads of a lead frame with the bar resting in a central bar pad in the frame. Following the threading operation the lead frame and bar are encased in epoxy with the pins of the lead frame extending outwardly and the epoxy cured. The pins are then trimmed and bent into shape. The rapid trend towards putting more circuity into a given size of package indicates a need to develop a means for placing more than 1 in a single package.

Accordingly, a principal object of the present invention is to improve the packaging of VLSI devices. It is a further object of the present invention to provide a method of packaging which increases the amount of circuitry housed in a single package for VLSI devices.

SUMMARY OF THE INVENTION

According to the invention there is provided a method of packaging VLSI devices which includes depositing a second level metal layer onto a active surface of each of two identical semiconductor circuit bars, patterning, and etching a plurality of second level bonding pads, second level bonding lands contacting bar bonding pads of the bars and second level pad leads interconnecting the second level bonding pads to respective second level bonding lands of the second level metal. Each second level pad is associated with one of the second level lands formed on a true bar and there is a corresponding second level pad associated with an equivalent second level pad on a mirror bar. The latter or mirror second level pad is positioned on the active surface of the mirror bar such that it contacts the corresponding second level pad on the true bar when the active surfaces of the true and mirror bars face each other and the second level pads thereon are aligned. At least one second level pad on the true bar aligns with a dummy second level pad of the mirror bar that is not connected to a second level land on the mirror bar and at least one second level pad on the mirror bar other than the dummy second level pad thereon aligns with a dummy second level pad on the true bar which is not connected to a second level land. A lead frame is formed with a plurality of pins and frame pads connected to corresponding ones of the pins such that the frame pads are formed on both opposed flat surfaces of the lead frame and are alignable with the second level pads on the bars. The second level pads of each of the two bars are each bonded to a corresponding lead frame pad so as to be in electrical contact therewith. The lead frame and attached bars are encapsulated and the lead pins trimmed and formed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
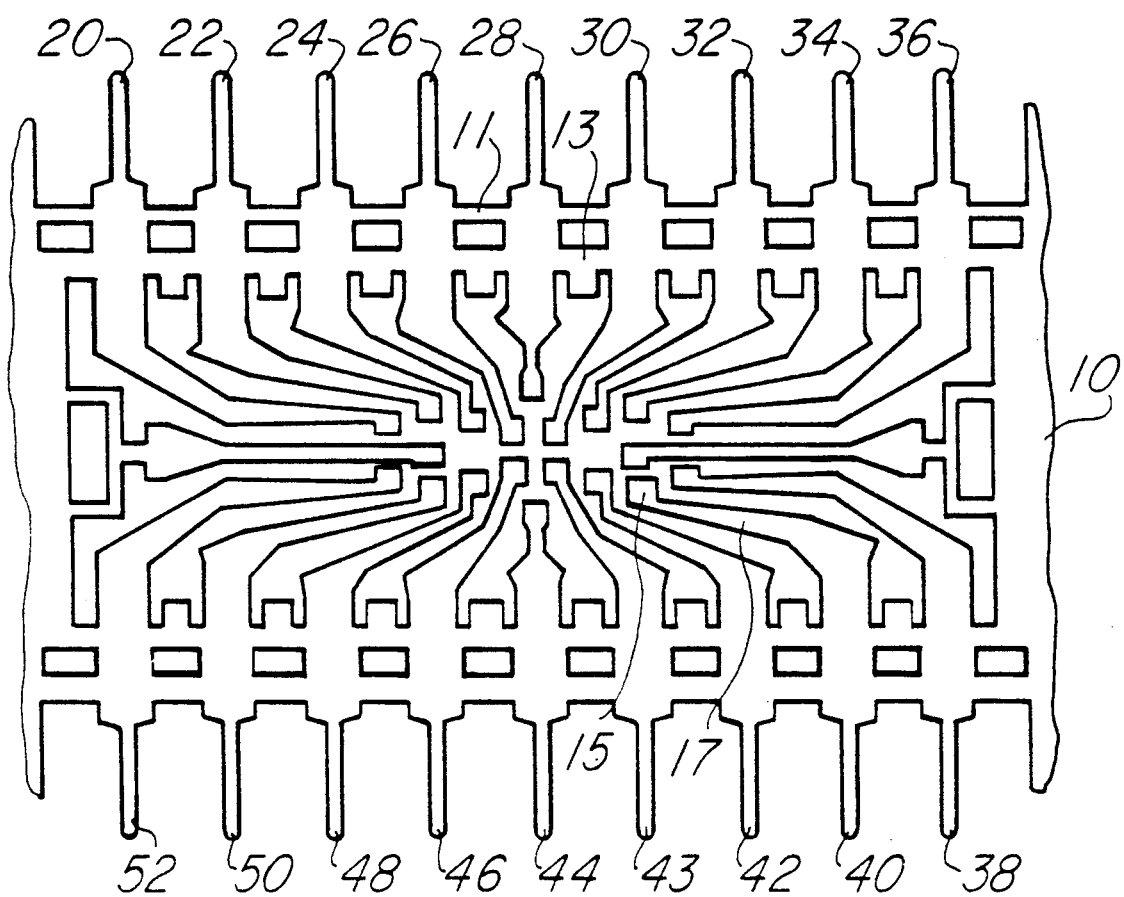
FIG. 1 is a plan view of a lead frame.

Referring to FIG. 1 there is shown a lead frame 10 made of conductive material which is one of a plurality of interconnected multiple lead frames in sheet form (not shown). Each lead frame 10 has a plurality of frame bonding pads 15 connected by frame leads 17 to corresponding pins 20, 22, etc. Each pin is coupled to adjacent pins by an inner web 13 and an outer web 11 which support the frame structure prior to encapsulation.

Figure 2:
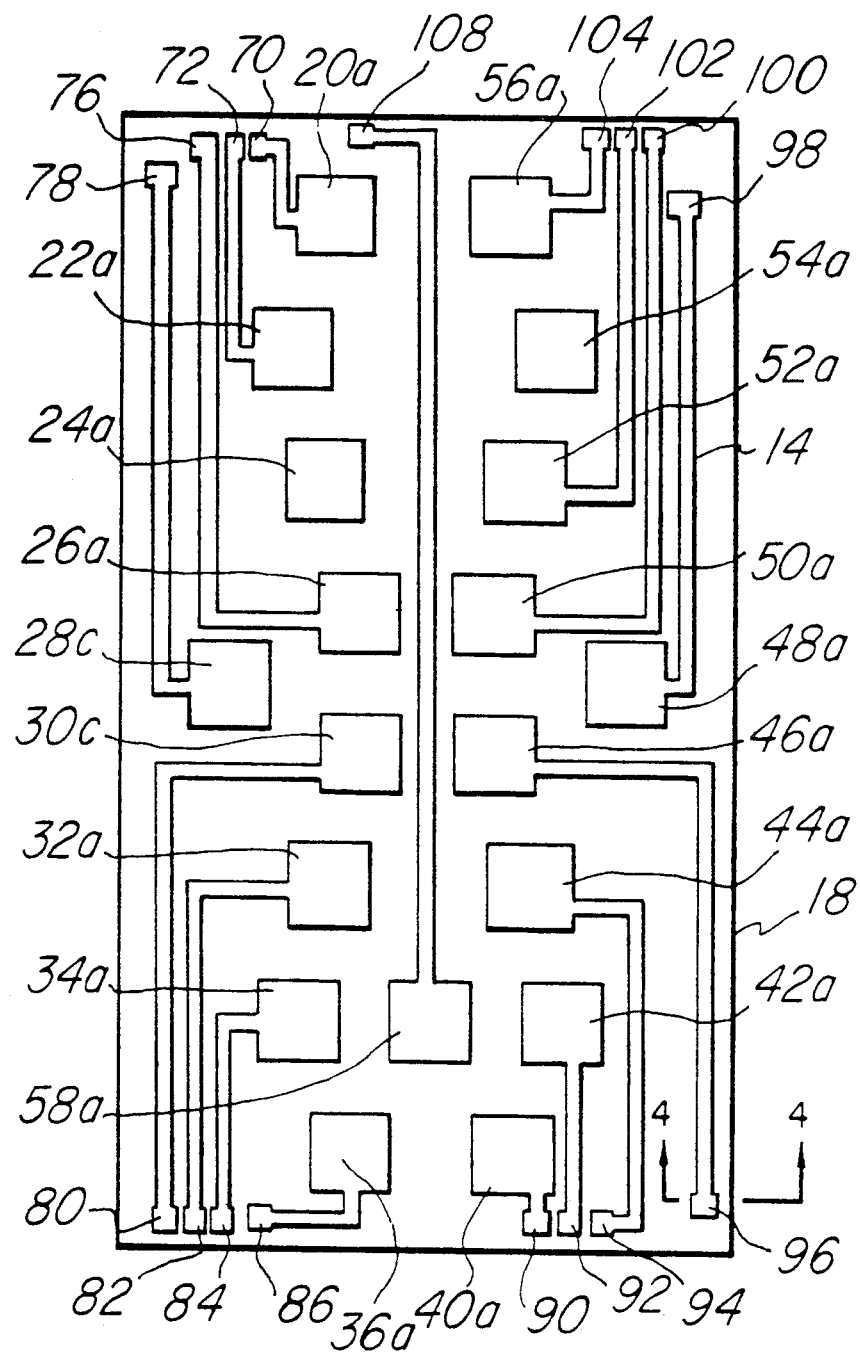
FIG. 2 is a plan view of a bar with second level lands, leads and pads formed on one surface thereof.

Referring to FIG. 2, there is shown a bar 18 with a plurality of second level bonding lands 70, 72, 76, etc. at either end thereof. On the active surface of the bar 18 there is deposited a second level layer of metal consisting of a lower 1,000 Angstroms layer of chromium, a 5,000 Angstrom layer of copper and a 8,000 Angstrom layer of gold. The metal layer is patterned and etched to form a plurality of spaced apart metal second level pads 20a, 22a, 24a, etc., lands 70, 72, etc and leads 14 interconnecting the second level pads and lands. The area of said bonding pads is at least 400 square mils.

Figure 3:
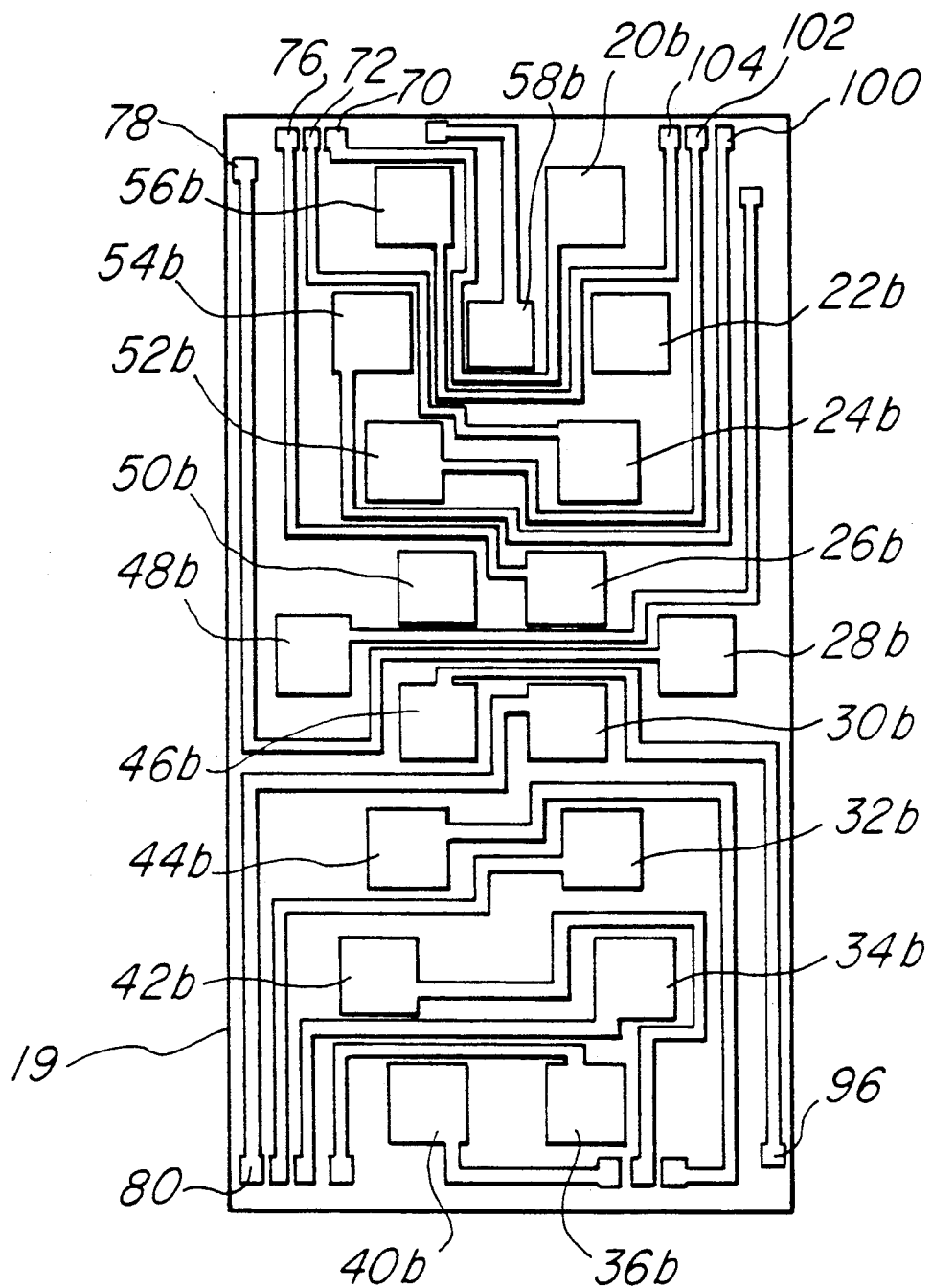
FIG. 3 is a plan of a bar with second level lands, lead and pads and the pads being laid out in the mirror image of those of FIG. 2.

Referring to FIG. 3 there is shown a bar 19 with a plurality of second level lands 70, 72, 76. Similar to the process outined for bar 18, a second level metal is patterned, and etched to form a spaced apart array of second level pads 20b, 22b, 24b, 26b . . . which are connected to second level lands 70, 72, 76, etc. The latter are the equivalent bonding lands as those of like reference numbers on bar 18. However, pads 20b, 22b, 26b, etc. are arranged so that when the active surface of bar 18 is juxtaposed to that of bar 19, the second level pads on bar 18 align with corresponding second level pads on bar 19. However, second level pads 24a and 54a of bar 18 and 22b and 50b on bar 19 are dummy pads in that they do not connect to any second level lands. In addition, second level pad 58a on bar 18 and 58b on bar 19 are provided to allow an optional connection to the back side of respective bars 18 and 19.

Figure 4:
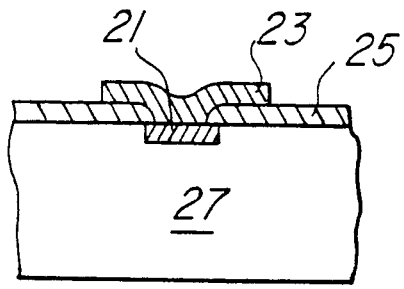
FIG. 4 is an elevation view taken along line 4—4 of FIG. 2 showing only detail with respect to the bar bonding pad.

Referring to FIG. 4 there is shown a typical metal bar bonding pad 21 on a portion of a silicon bar 27 exposed through a hole in a protective oxide coating 25 and a metal second level land 23 contacting the bar bonding pad 21. In this case the second level land 23 is formed at the same time as are the second level pads and pad leads with successive layers of chromium, copper and gold.

Figure 5:
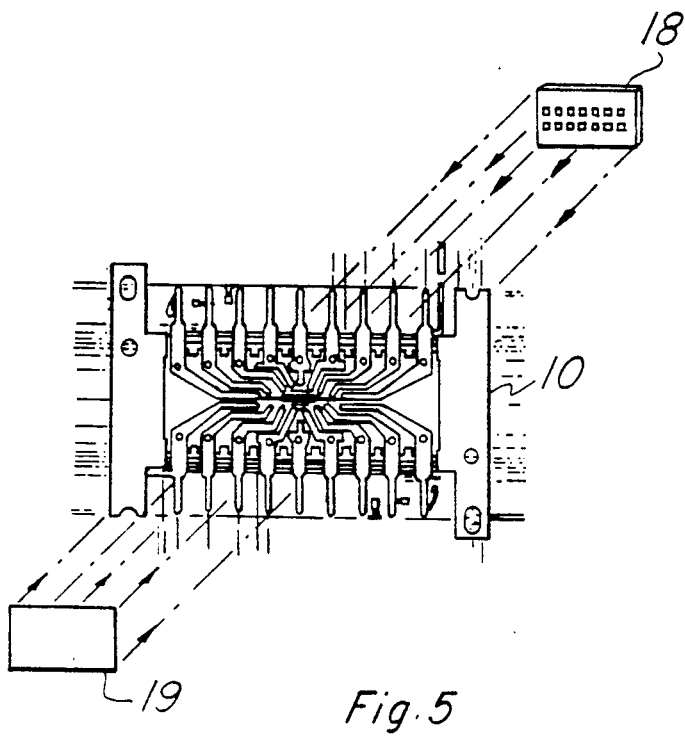
FIG. 5 is an exploded perspective view of the lead frame and bars in assembled form.
Figure 6:
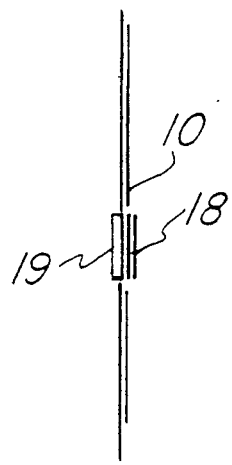
FIG. 6 is an end view of the two bars and lead frame in assembled form.

Next either the second level pads of bar 18 and 19 and/or the frame pads 15 are sandwiched between and aligned with the second level pads of bars 18 and 19 as shown in FIGS. 5 and 6. A vapour phase solder process is used to weld the second level pads and frame pads together. Alternatively, an electrically conductive epoxy can be used in place of solder. Next the individual bars are encapsulated in an insulating package material 54 and their lead pins trimmed and bent to shape.

For a 256K DRAM the pin configurations are as set forth below:

TABLE 1

| Pin No. | Secondary pads Bar 18 | Secondary pads Bar 19 | Pads in Common? | Pin Code | Pin Description |
|---|---|---|---|---|---|
| 20 | 20a | 20b | Yes | A8 | Address 8 |
| 22 | 22a | 22b | No | DT | Data-In bar 18 |
| 24 | 24a | 24b | No | DM | Data-In bar 19 |
| 26 | 26a | 26b | Yes | W | Write enable |
| 28 | 28a | 28b | Yes | RAS | Row address strobe |
| 30 | 30a | 30b | Yes | A0 | Address 0 |
| 32 | 32a | 32b | Yes | A2 | Address 2 |
| 34 | 34a | 34b | Yes | A1 | Address 1 |
| 36 | 36a | 36b | Yes | Vdd | 5 volt supply |
| 40 | 40a | 40b | Yes | A7 | Address 7 |
| 42 | 42a | 42b | Yes | A5 | Address 5 |
| 44 | 44a | 44b | Yes | A4 | Address 4 |
| 46 | 46a | 46b | Yes | A3 | Address 3 |
| 48 | 48a | 48b | Yes | A6 | Address 6 |
| 50 | 50a | 50b | No | QT | Data-Out bar 18 |
| 52 | 52a | 52b | Yes | CAS | Column address strobe |
| 54 | 54a | 54b | No | QM | Data-Out bar 19 |
| 56 | 56a | 56b | Yes | Vss | Substrate (ground) voltage |

With the configuration of pins as set forth in Table 1 a 256K DRAM set of 2 bars operates as a 256K×2 memory device. Dummy pad 24a ensures that data on this pin enters only bar 19 while dummy pad 22b ensures that data on this pin enter only bar 18. Similarly, dummy pad 50b ensures that data on this pin comes only from bar 18 while dummy pad 54a ensures that data on this pin comes only from bar 19. Pins 58a and 58b may optionally be coupled to the back of the bars 18 and 19, repectively. As seen in table 1, all of the pairs of second level pads of bars 18 and 19 corresponding to second level pads of like numbers are in common except for two pads on each of bars 18 and 19, which form a pair of semiconductor circuit bars. Using second level pads 24a and 54a as dummy pads ensures that data input on pin 24 goes only to the Data-In of bar 19 and data is outputted on pin 54 only from the Data-Out of bar 19. Similarly, using second level pads 22b and 50b ensures that data input on pin 22 enters the Data-In only of bar 18 and only data outputted from the Data-Out of bar 18 appears on pin 50. Identical connections can be used for DRAM's of higher (or Lower) memory capacity.

Alternatively, two 256K DRAMS may also be connected in a 512K×1 configuration by simply making a dummy pad on bar 19 to align with the RAS pad of bar 18 and a dummy pad on bar 18 to align with the RAS pad of bar 19. All other pads of like function of bars 18 and 19 would be connected together and to a corresponding pin of the lead frame 10. The row address strobe of bar 18 would enable only bar 18 while that for bar 19 would enable only bar 19. The same principal can be applied to memory devices of a higher memory capacity such as a 1 megabit DRAM converting it into either a 2 megabit×1 DRAM or into a 1 megabit×2 DRAM. With a slight increase in the amount of processing and very little increased cost it is possible to expand the memory capacity of a device for a given package size.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A semiconductor integrated circuit device comprising:

a pair of semiconductor circuit bars having active faces and having a plurality of spaced apart second level bonding pads, a plurality of spaced apart second level bonding lands and second level leads interconnecting said second level pads and second level lands formed on said active faces of said bars, the layout of said second level bonding lands on each of said bars being the same while the layout of said second level bonding pads on each of said bars are mirror images of one another such that juxtaposing said active faces of said pair of bars aligns corresponding ones of said second level bonding pads; and a lead frame having a plurality of pins and having a plurality of frame bonding pads interconnected with corresponding respective pins, said lead frame being sandwiched between said active faces of said pair of bars with said frame pads being bonded to corresponding second level bonding pads of said pair of bars.

2. The device of claim 1, in which the area of said second level bonding pads is at least 400 square mils.

3. The device of claim 1, in which said second level pads and leads are formed of a layer of chromium under a layer of copper under a layer of gold.

4. The device of claim 1, in which said pair of bars are each DRAMs and the second level bonding pads on a first of said pair of bars corresponding to the second bar Data-in and Data-out pads are dummy pads and the second level bonding pads on said second bar corresponding to the first bar Data-in and Data-out pads are dummy pads.

5. The device of claim 1, in which said pair of bars are each DRAMs and one of said bars having a dummy pad for a second level bonding pad corresponding to the row address strobe pad on the other bar, the other of said bars having a dummy pad for a second level bonding pad corresponding to the row address strobe pad on the one bar and the Data-in pads on each of said bars are in common as are the Data-out pads on each of said bars.

6. The device of claim 1 in which said second level pads, leads and lands are made of metal.

7. A semiconductor circuit bar adapted to be bonded to one side of a lead frame that has a similar semiconductor circuit bar bonded to the other side of said lead frame, said lead frame having a plurality of pins and having a plurality of frame bonding pads interconnected with corresponding respective pins, said semiconductor circuit bar comprising:
  A. an active face;
  B. plural spaced apart bar bonding pads on said active face arranged identical to corresponding ones of plural bar bonding pads on a similar active face of said similar semiconductor circuit bar;
  C. plural spaced apart second level bonding lands overlying and contacting corresponding ones of said bar bonding pads;
  D. plural spaced apart second level bonding pads on said active face, said second level bonding pads adapted to be bonded to desired ones of said frame bonding pads, and being arranged in a mirror image to corresponding ones of plural spaced apart second level bonding pads on said similar active face of said similar semiconductor circuit bar; and
  E. plural second level leads on said active face interconnecting corresponding ones of said second level bonding lands and second level bonding pads, said second level leads being arranged different from corresponding ones of plural second level leads interconnecting, at least partly, said plural bar bonding pads on said similar active face and said second level bonding pads on said similar active face.

8. The circuit bar of claim 7 in which the area of said second level bonding pads on said active face is at least 400 square mils.

9. The circuit bar of claim 7 in which at least said second level pads and leads are formed of a layer of chromium under a layer of copper under a layer of gold.

10. The circuit bar of claim 7 in which said circuit bar and said similar circuit bar are DRAMS and said second level bonding pads on said active face including dummy pads arranged in a mirror image to the Data-in and Data-out second level bonding pads on said similar active face.

11. The circuit bar of claim 7 in which said circuit bar and said similar circuit bar are DRAMS and said second level bonding pads on said active face include a dummy pad arranged in a mirror image to a row address strobe second level bonding pad on said similar active face.

12. The circuit bar of claim 7 in which said second level pads, leads and lands on said active face are made of metal.

13. The circuit bar of claim 7 in which said circuit bar is a 256K DRAM and said second level bonding pads on said active face are adapted to be bonded to said frame bonding pads in a configuration of a 256K × 2 memory device.

14. The circuit bar of claim 7 in which said circuit bar is a 256K DRAM and said second level bonding pads on said active face are adapted to be bonded to said frame bonding pads in a configuration of a 512K × 1 memory device.

15. The circuit bar of claim 7 in which said circuit bar is a 1 megabit DRAM and said second level bonding pads on said active face are adapted to be bonded to said frame bonding pads in a configuration of a 1 megabit × 2 memory device.

16. The circuit bar of claim 7 in which said circuit bar is a 1 megabit DRAM and said second level bonding pads on said active face are adapted to be bonded to said frame bonding pads in a configuration of a 2 megabit × 1 memory device.

17. A semiconductor integrated circuit device comprising:
  A. a lead frame having a plurality of pins and having a plurality of frame bonding pads interconnected with corresponding respective pins, the frame bonding pads being capable of bonding on opposed sides of said lead frame;
  B. at least one pair of semiconductor integrated circuit bars, each circuit bar having bonding pads arranged in mirror image of one another and the pair of circuit bars being bonded on opposed sides of said lead frame by said bonding pads of each circuit bar being bonded to corresponding frame bonding pads; and
  C. encapsulation material surrounding said circuit bars, frame bonding pads, and at least a part of each of said pins.

18. The device of claim 17 in which said circuit bars have bar bonding pads arranged identical with one another and at least pad leads on each circuit bar interconnecting corresponding bar bonding pads and bonding pads.

19. The device of claim 17 in which said circuit bars are DRAMS.

20. The device of claim 17 in which each of said circuit bars have Data-in and Data-out bonding pads and the Data-in and Data-out bonding pads of the pair of circuit bars are separate from one another in bonding to said frame bonding pads.

21. The device of claim 17 in which said circuit bars have Data-in bonding pads bonded to the same frame bonding pad, and Data-out bonding pads bonded to the same frame bonding pad, and the pair of circuit bars each having a row address strobe bonding pad bonded to frame bonding pads separate from one another.

22. The device of claim 1 or 17 in which each of said circuit bars are 256K DRAMS and said bonding pads being bonded to said frame bonding pads in a configuration of a 256K × 2 memory device.

23. The device of claim 1 or 17 in which each of said circuit bars are 256K DRAMS and said bonding pads being bonded to said frame bonding pads in a configuration of a 512K × 1 memory device.

24. The device of claim 1 or 17 in which each of said circuit bars are 1 megabit DRAMS and said bonding pads being bonded to said frame bonding pads in a configuration of a 1 megabit × 2 memory device.

25. The device of claim 1 or 17 in which each of said circuit bars are 1 megabit DRAMS and said bonding pads being bonded to said frame bonding pads in a configuration of a 2 megabit × 1 memory device.

* * * * *